US011854946B2

(12) United States Patent
Ozawa

(10) Patent No.: US 11,854,946 B2
(45) Date of Patent: Dec. 26, 2023

(54) SEMICONDUCTOR DEVICE WITH SEALED SEMICONDUCTOR CHIP

(71) Applicant: KIOXIA CORPORATION, Tokyo (JP)

(72) Inventor: Isao Ozawa, Chigasaki (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/864,064

(22) Filed: Jul. 13, 2022

(65) Prior Publication Data
US 2022/0352053 A1 Nov. 3, 2022

Related U.S. Application Data

(63) Continuation of application No. 16/952,968, filed on Nov. 19, 2020, now Pat. No. 11,424,176, which is a
(Continued)

(30) Foreign Application Priority Data

May 11, 2005 (JP) .................................. 2005-138718
Oct. 4, 2005 (JP) .................................. 2005-291391
Apr. 19, 2006 (JP) .................................. 2006-115959

(51) Int. Cl.
*H01L 23/495* (2006.01)
*H01L 23/28* (2006.01)
*H01L 23/00* (2006.01)

(52) U.S. Cl.
CPC ............ *H01L 23/495* (2013.01); *H01L 23/28* (2013.01); *H01L 23/4951* (2013.01);
(Continued)

(58) Field of Classification Search
CPC ....... H01L 2924/00014; H01L 2924/00; H01L 2224/48091; H01L 2224/48247;
(Continued)

(56) References Cited

U.S. PATENT DOCUMENTS 4,943,843 A * 7/1990 Okinaga .................. H01L 24/32
257/E23.056
5,780,925 A * 7/1998 Cipolla ............. H01L 23/49575
257/676
(Continued)

FOREIGN PATENT DOCUMENTS

JP 6-151685 5/1994
JP 6-204390 7/1994
(Continued)

OTHER PUBLICATIONS

Japanese Office Action dated Aug. 30, 2011 in Patent Application No. 2006-115959 (with English translation).
(Continued)

*Primary Examiner* — Meiya Li
(74) *Attorney, Agent, or Firm* — Oblon, McClelland, Maier & Neustadt, L.L.P.

(57) ABSTRACT

A semiconductor device includes a semiconductor chip with bonding pads, the bonding pads being arranged along one side of an element forming surface of the semiconductor chip, a lead frame including first and second internal leads arranged such that tips thereof correspond to some of the bonding pads of the semiconductor chip, and first and second bonding vires by which the first internal leads and the some of the bonding pads are bonded to each other. The semiconductor device further includes a hanging pin section provided on the element non-forming surface of the semiconductor chip, and a sealing member with which the semiconductor chip is sealed including the hanging pin section and a bonding section between the first and second internal leads and the first and second bonding wires.

8 Claims, 12 Drawing Sheets

Related U.S. Application Data continuation of application No. 16/438,826, filed on Jun. 12, 2019, now Pat. No. 10,872,844, which is a continuation of application No. 14/617,637, filed on Feb. 9, 2015, now Pat. No. 10,366,942, which is a continuation of application No. 13/029,466, filed on Feb. 17, 2011, now Pat. No. 8,970,019, which is a continuation of application No. 11/430,965, filed on May 10, 2006, now Pat. No. 7,919,837.

(52) U.S. Cl.
CPC ........ *H01L 23/49575* (2013.01); *H01L 24/49* (2013.01); *H01L 24/48* (2013.01); *H01L 2224/48091* (2013.01); *H01L 2224/48247* (2013.01); *H01L 2224/48257* (2013.01); *H01L 2224/49171* (2013.01); *H01L 2225/06562* (2013.01); *H01L 2924/00014* (2013.01); *H01L 2924/01002* (2013.01); *H01L 2924/01004* (2013.01); *H01L 2924/01005* (2013.01); *H01L 2924/01006* (2013.01); *H01L 2924/01019* (2013.01); *H01L 2924/01023* (2013.01); *H01L 2924/01033* (2013.01); *H01L 2924/01037* (2013.01); *H01L 2924/01058* (2013.01); *H01L 2924/01075* (2013.01); *H01L 2924/01082* (2013.01); *H01L 2924/07802* (2013.01); *H01L 2924/12042* (2013.01); *H01L 2924/14* (2013.01); *H01L 2924/1532* (2013.01); *H01L 2924/181* (2013.01); *H01L 2924/3025* (2013.01)

(58) Field of Classification Search
CPC . H01L 2224/49171; H01L 2924/07802; H01L 2924/12042; H01L 2924/181; H01L 2224/05599; H01L 2224/45099; H01L 2224/48257; H01L 2225/06562; H01L 23/4951; H01L 23/49575; H01L 24/48; H01L 24/49; H01L 2924/00012; H01L 2924/01002; H01L 2924/01004; H01L 2924/01005; H01L 2924/01006; H01L 2924/01019; H01L 2924/01023; H01L 2924/01033; H01L 2924/01037; H01L 2924/01058; H01L 2924/01075; H01L 2924/01082; H01L 2924/14; H01L 2924/1532; H01L 2924/3025; H01L 23/28; H01L 23/495

See application file for complete search history.

(56) References Cited

U.S. PATENT DOCUMENTS

| | | | |
|---|---|---|---|
| 5,907,769 | A | 5/1999 | Corisis |
| 6,184,574 | B1 | 2/2001 | Bissey |
| 7,339,257 | B2 | 3/2008 | Ozawa et al. |
| 7,375,415 | B2 | 5/2008 | Lee |
| 11,424,176 | B2 * | 8/2022 | Ozawa ................ H01L 23/495 |
| 2003/0107121 | A1 | 6/2003 | Roohparvar |
| 2007/0001272 | A1 * | 1/2007 | Lee .................... H01L 23/4951 |
| | | | 257/E23.047 |
| 2008/0150103 | A1 | 6/2008 | Wang |

FOREIGN PATENT DOCUMENTS

| | | |
|---|---|---|
| JP | 6-224362 | 8/1994 |
| JP | 8-195463 | 7/1996 |
| JP | 8-227903 | 9/1996 |
| JP | 11-54685 | 2/1999 |
| JP | 11-121677 | 4/1999 |
| JP | 2001-102515 | 4/2001 |
| JP | 2001-217383 | 8/2001 |
| KR | 2002-0066326 | 8/2002 |

OTHER PUBLICATIONS

Final Notice of Rejection dated Jan. 10, 2012 in Japanese Patent Application No. 2006-115959 (with English translation).

Japanese Office Action dated Jun. 3, 2014, in Japanese Patent Application No. 2012-285961 (with English translation).

\* cited by examiner

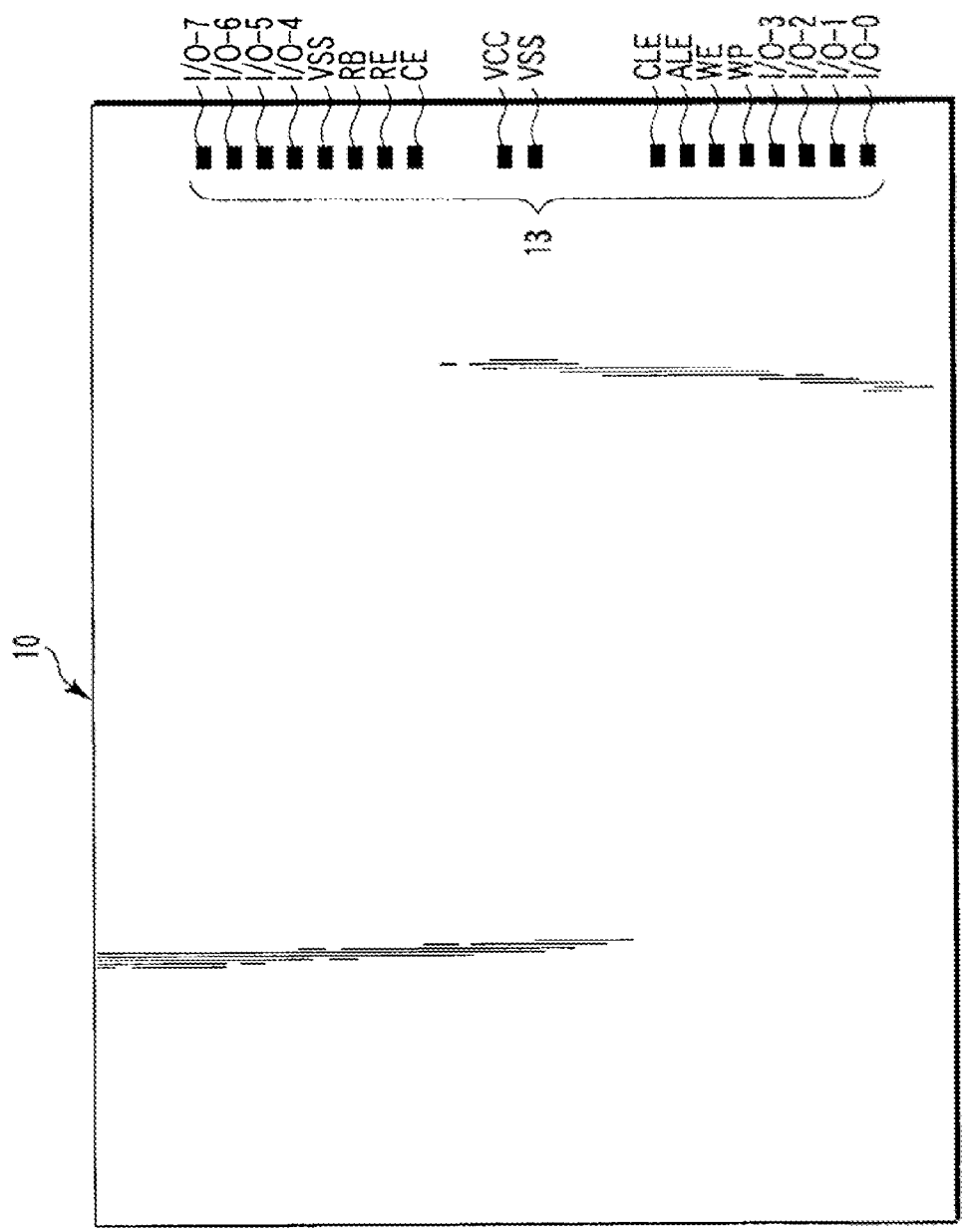
F I G. 5

SEMICONDUCTOR DEVICE WITH SEALED SEMICONDUCTOR CHIP

CROSS-REFERENCE TO RELATED APPLICATIONS

This application is a continuation application of U.S. application Ser. No. 16/952,968, filed on Nov. 19, 2020 (now U.S. Pat. No. 11,424,176), which is a continuation application of U.S. application Ser. No. 16/438,826, filed on Jun. 12, 2019 (now U.S. Pat. No. 10,872,844), which is a continuation of U.S. application Ser. No. 14/617,637 (now U.S. Pat. No. 10,366,942), filed on Feb. 9, 2015, which is a continuation of U.S. application Ser. No. 13/029,466 (now U.S. Pat. No. 8,970,019), filed on Feb. 17, 2011, which is a continuation of U.S. application Ser. No. 11/430,965 (now U.S. Pat. No. 7,919,837), filed on May 10, 2006, and is based upon and claims the benefit of priority from prior Japanese Patent Applications No. 2005-138718, filed May 11, 2005; No. 2005-291391, filed Oct. 4, 2005; and No. 2006-115959, filed Apr. 19, 2006, the entire contents of all of which are incorporated herein by reference.

BACKGROUND OF THE INVENTION

1. Field of the Invention

The present invention relates to a semiconductor device. More specifically, the invention relates to a semiconductor device having a package structure in which a semiconductor chip with a plurality of pads along one side thereof is mounted on a lead frame and sealed with resin or the like (referred to as a packaged semiconductor device hereinafter).

2. Description of the Related Art

A packaged semiconductor device having a ball grid array (BGA) structure in which a plurality of pads are all arranged along one side of a semiconductor chip, has recently been developed (Jpn. Pat. Appln. KOKAI Publication No. 2001-102515, pages 4 and 5 and FIG. 1, for example). In the packaged semiconductor device, the semiconductor chip is stacked on and displaced from a low-level chip, thereby reducing the size of the semiconductor chip and facilitating wire bonding.

If, however, a semiconductor chip with a plurality of pads along one side thereof is applied to a packaged semiconductor device having a thin small outline package (TSOP) structure, the following problem occurs. In this packaged semiconductor device, the semiconductor chip is fixed on a die pad section of a lead frame by an insulative adhesive, and the pads on the chip are connected to the internal leads of the lead frame by bonding wires, respectively. Some of the internal leads are arranged close to the pads, whereas the others are arranged away from the pads. In order to connect the latter internal leads to the pads, very long bonding wires are required. In the subsequent resin-sealing process, the long bonding wires are easily dropped due to resin, and adjacent bonding wires are easily brought into contact with each other (electrically short-circuited).

Jpn. Pat. Appln. KOKAI Publication No. 2001-217383 discloses a semiconductor device in which a semiconductor chip with a plurality of bonding pads along one side of the main surface thereof and another semiconductor chip of the same type are stacked on the substrate and thus the bonding pads of these chips are close to each other.

BRIEF SUMMARY OF THE INVENTION

According to a first aspect of the present invention, there is provided a semiconductor device comprising a semiconductor chip with bonding pads, the bonding pads being arranged along one side of an element forming surface of the semiconductor chip; a lead frame including first internal leads and second internal leads, the first internal leads being arranged such that tips thereof correspond to some of the bonding pads of the semiconductor chip, and the second internal leads being arranged such that tips thereof pass a element non-forming surface of the semiconductor chip and correspond to some of other bonding pads of the semiconductor chip; first bonding wires by which the first internal leads and the some of the bonding pads are connected to each other; second bonding wires by which the second internal leads and the some of other bonding pads are connected to each other; a hanging pin section provided on the element non-forming surface of the semiconductor chip; and a sealing member with which the semiconductor chip is sealed including the hanging pin section and a bonding section between the first and second internal leads and the first and second bonding wires.

According to a second aspect of the present invention, there is provided a semiconductor device comprising a semiconductor chip with bonding pads, the bonding pads being arranged along one side of an element forming surface of the semiconductor chip; a lead frame including internal leads, the internal leads being arranged on the element forming surface of the semiconductor chip and close to the bonding pads thereof such that tips of the internal leads correspond to the bonding pads of the semiconductor chip; bonding wires by which the tips of the internal leads and the bonding pads of the semiconductor chip are bonded; a hanging pin section provided on the element forming surface of the semiconductor chip; and a sealing member with which the semiconductor chip is sealed including the hanging pin section and a bonding section between the internal leads and the bonding wires, the sealing member being rectangular.

BRIEF DESCRIPTION OF THE SEVERAL VIEWS OF THE DRAWING

FIG. 5 is a plan view of external terminals assigned to bonding pads of the semiconductor chip shown in FIGS. 4A and 4B;

DETAILED DESCRIPTION OF THE INVENTION

Embodiments of the present invention will be described with reference to the accompanying drawings. It should be noted that the drawings are schematic ones and the dimension ratios shown therein are different from the actual ones. The dimensions vary from drawing to drawing and so do the ratios of dimensions.

First Embodiment

Figure 1:
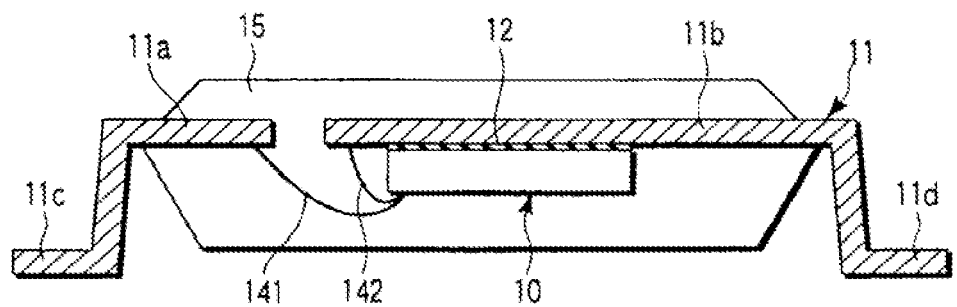
FIG. 1 is a sectional view showing a configuration of a packaged semiconductor device having a TSOP structure according to a first embodiment of the present invention.
Figure 2:
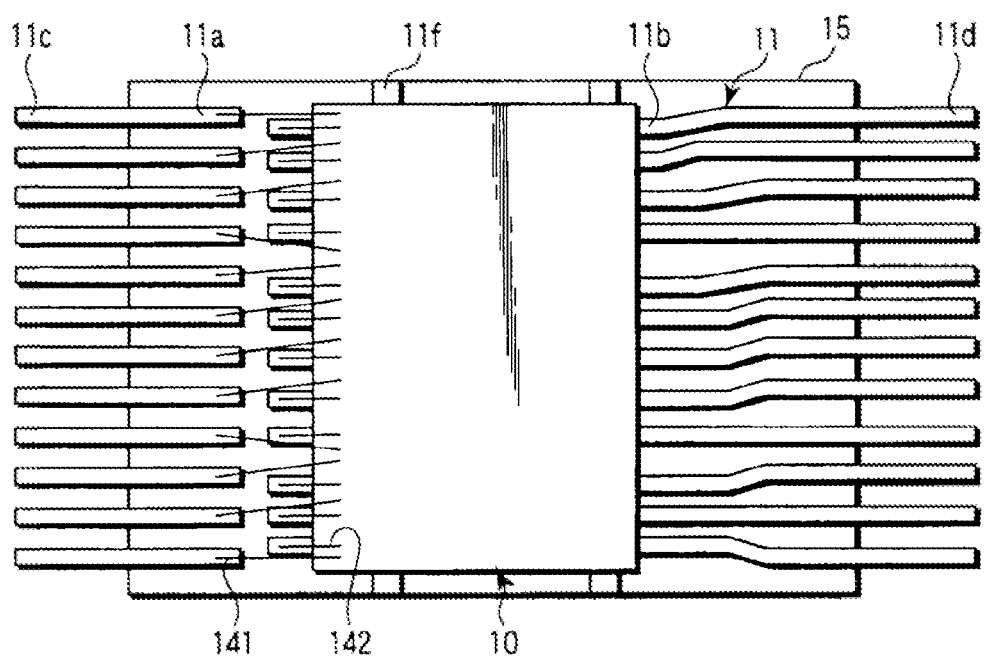
FIG. 2 is a bottom view of the packaged semiconductor device shown in FIG. 1 to view the inside thereof from the bottom thereof.
Figure 3:
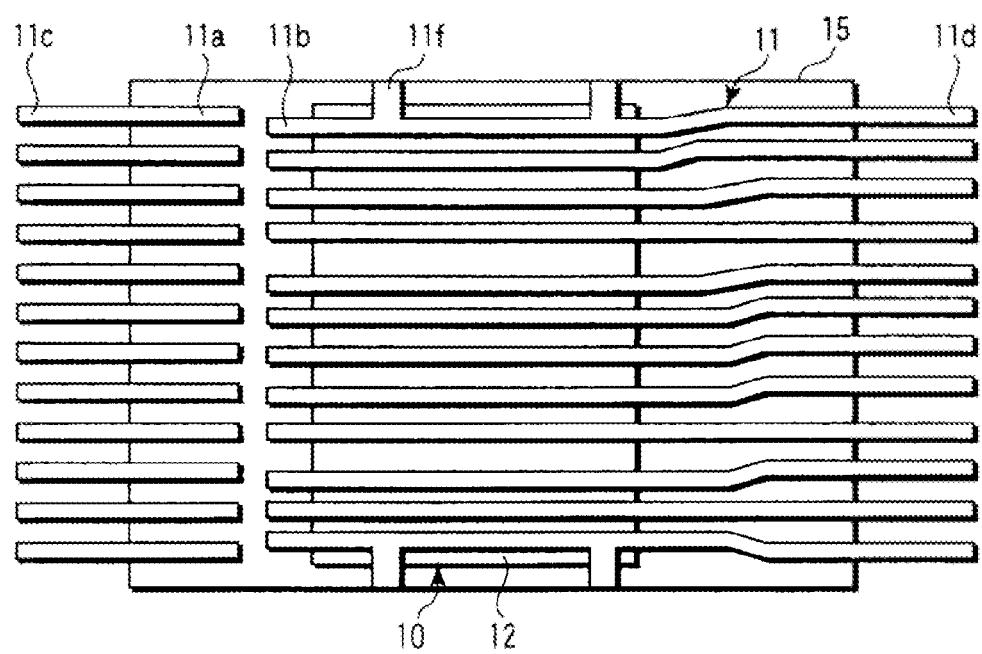
FIG. 3 is a top view of the packaged semiconductor device shown in FIG. 1 to view the inside thereof from the top thereof.

FIGS. 1 to 3 show a basic configuration of a semiconductor device (packaged semiconductor device) having a TSOP structure according to a first embodiment of the present invention. Of these figures, FIG. 1 is a sectional view of the packaged semiconductor device, FIG. 2 is a bottom view of the packaged semiconductor device to view the inside thereof from the back surface, and FIG. 3 is a top view of the packaged semiconductor device to view the inside thereof from the top surface.

Referring to FIGS. 1 to 3, a lead frame 11 includes external leads 11c and 11d, internal leads 11a and 11b, and a hanging pin section 11f. The internal leads 11a and 11b correspond to internally extended portions of the external leads 11c and 11d. The internal leads 11a and 11b differ from each other in length. For example, some (middle ones) of the internal leads 11b, which are longer than the internal leads 11a, are used as a die lead section (chip mounting section) on which a semiconductor chip 10 is mounted. The internal leads 11a and 11b are not depressed from each other, but almost flush with each other.

The hanging pin section 11f is connected to each of the outermost ones of the longer internal leads 11b.

Figure 4A:
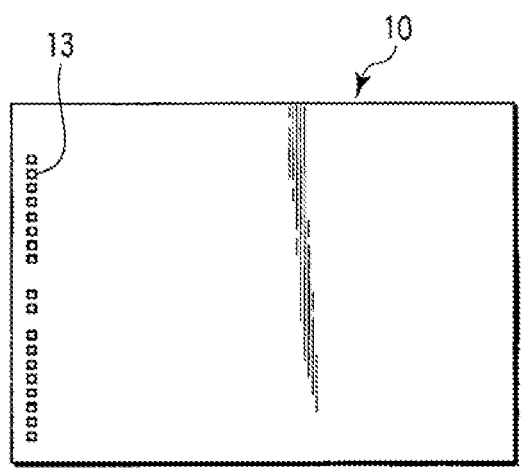
FIG. 4A is a plan (top) view showing a configuration of a semiconductor chip that is applied to the packaged semiconductor device shown in FIG. 1.
Figure 4B:
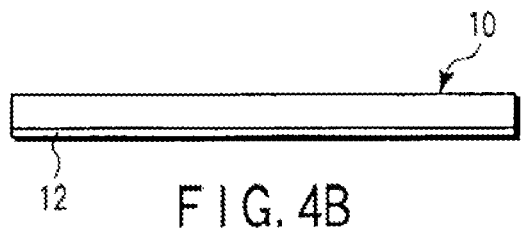
FIG. 4B is a side view of the semiconductor chip shown in FIG. 4A.

As shown in FIGS. 4A and 4B, bonding pads 13 are arranged on the element forming surface of the semiconductor chip 10 and along one side of the chip 10. A thin sheet-shaped organic insulation film 12 having a thickness of about 20 μm to 40 μm is adhered to the back surface (element non-forming surface) of the chip 10. The organic insulation film 12 is made of, e.g., polyimide epoxy resin.

The semiconductor chip 10 is mounted on the die lead section of the longer internal leads 11b and the hanging pin section 11f by the organic insulation film 12 and a normal mounting agent. The bonding pads 13 are close to the shorter internal leads 11a on which the semiconductor chip 10 is not mounted. In other words, the tips of the shorter internal leads 11a are opposed to the bonding pads 13, and the longer internal leads 11b pass the back surface of the chip 10 and extend such that their tips are located between the chip 10 and the shorter internal leads 11a.

The organic insulation film 12 is used to enhance the insulativeness between the back surface of the chip 10 and the die lead section. A film-shaped insulative adhesive, which is attached to the back of a wafer, can be used as the organic insulation film 12 in a scribe (dicing) step of separating the chip 10 from the wafer. There is a case where the organic insulation film 12 is not used when a plurality of semiconductor chips are stacked one on another.

As shown in FIGS. 1 and 2, the shorter internal leads 11a on which the chip 10 is not mounted, or the internal leads 11a located away from the bonding pads 13 are connected to some of the bonding pads 13 by first bonding wires 141. On the other hand, the tips of the longer internal leads 11b on which the chip 10 is mounted are connected to some of the other bonding pads 13 by second bonding wires 142.

The internal leads 11a end 11b, hanging pin section 11f, chip 10 and bonding wires 141 and 142 of the lead frame 11 are sealed with resin (sealing member) 15 to form a resin package. The resin package is so configured that the sealed portion of the lead frame 11 on the chip-mounting surface (the back of the packaged semiconductor device) is thicker than that on the chip non-mounting surface (the surface of the packaged semiconductor device). Thus, the chip 10 is sealed in almost the middle part of the resin package in its thickness direction.

The portions communicating with the internal leads 11a and 11b protrude from at least opposing sides of the resin package to form the external leads 11c and 11d (parts of the lead frame 11). In other words, the external leads 11c and 11d protrude from a position that is higher than the middle of the resin package in its thickness direction. The external leads 11c and 11d extend along the sides of the semiconductor chip 10 and bend toward the chip mounting surface of the lead frame 11. The tips of the external leads 11c and 11d bend away from the resin package and serve as external terminals. In other words, the chip 10 is sealed facedown in the resin package.

The packaged semiconductor device shown in FIGS. 1 to 3 has a chip-on-lead (COL) structure in which the chip 10 is adhesively fixed to the longer internal leads 11b and the internal leads 11a and 11b are connected to the bonding pads 13 by the bonding wires 141 and 142. The internal leads 11a and 11b are arranged on almost the same plane and not depressed. Since none of them are depressed, a mounting step and a bonding step can easily be executed. If the lead frame is depressed, variations in depression affect the mounting and bonding steps. If a lead frame has to be depressed, a depressing step is required in manufacturing the lead frame. The depressing step makes the manufacturing complicated and exerts an adverse influence on frame manufacturing yields.

The hanging pin section 11f of the lead frame 11 is fixed to the element non-forming surface of the chip 10. When the lead frame 11 is sealed with resin 15, the moldability of the sealed frame 11 can be stabilized. The appearance of the semiconductor device can thus be enhanced more than a device in which the chip 10 is fixed by the internal leads 11v only.

The chip 10 is fixed on the die lead section corresponding to almost the middle portions of the longer internal leads 11b. The bonding pads 13 of the chip 10 are connected to the tips of the internal leads 11a and 11b which are close to the bonding pads 13 and, in other words, wire bonding is performed on one side of the chip 10 along which the bonding pads 13 are arranged. The bonding wires 141 and 142 need not be long; consequently, it is hot likely that the bonding wires will be dropped or adjacent bonding wires will be electrically short-circuited when the lead frame is sealed with resin after the wire-bonding step. Accordingly, the semiconductor device is improved in reliability.

The resin package is so configured that the sealed portion of the chip mounting section of the lead frame 11 is thicker than that of the chip non-mounting section thereof. The chip 10 can thus be sealed close to almost the middle of the resin package in its thickness direction.

The external leads 11c and 11d protrude from the sides of the resin package, extend along the sides of the semiconductor chip 10 and bend, toward the chip mounting section of the lead frame 11. The chip 10 is sealed facedown in the resin package. In a device assembly step, when the top surface of the formed resin package, or the resin package surface on the chip non-mounting surface of the lead frame 11 is irradiated with laser beams for marking, the internal leads 11b are interposed between the irradiated surface and the chip 10. The adverse effects of causing damage to the chip 10 by laser beams transmitted through the resin 15 or causing a disconnection by laser beams transmitted through the bending wires 141 and 142 can thus be lessened.

Since the bonding pads 13 are arranged locally along one side of the element forming surface of the semiconductor chip 10, the chip 10 can be decreased in size. A large-capacity memory chip such as a NAND flash memory varies in area because the wire connection of peripheral circuits is made efficient depending on how the peripheral circuits are laid out. When bonding pads are arranged locally along one side of the memory chip as in the chip 10 of the first embodiment, the wires are efficiently connected between the pads and the peripheral circuits and accordingly the memory chip is decreased in size. Thus, the first embodiment is favorably applied to, for example, a NAND flash memory as a large-capacity memory chip, which requires a low-cost multilayer packaging technique. An example of layout of a NAND flash memory with pads along one side thereof will be described later.

Since the internal leads 11a and 11b of the lead frame 11 are supplied with external signals or power supply or ground potentials, they have to be insulated from the semiconductor chip 10. An insulation-type pasty mounting agent or film-like mounting agent and the organic insulation film 12 of the back surface of the chip 10 can increase the electrical insulativeness between the chip 10 and the internal leads 11b with high reliability.

Since the chip 10 is adhered onto the die lead section by the thin organic insulation film 12, it is suitable for the TSOP structure. The difference in level between the top surface (element forming surface) of the chip 10 and the tips of the internal leads 11a and 11b can thus be lessened to facilitate wire bonding. Since, moreover, the bonding wires 141 and 142 are arranged locally in the direction of one side of the chip 10 mounted on the internal leads 11b, a larger chip can be mounted.

FIG. 5 shows an example of external terminals assigned to the bonding pads 13 arranged on the element forming surface of the semiconductor chip 10. In this example, a memory integrated circuit device such as a NAND flash memory is employed as the packaged semiconductor device. In the example of FIG. 5, the bonding pads 13 of the semiconductor chip 10 are laterally opposed to those of the chip shown in FIG. 4.

In the first embodiment, the number of bonding pads 13 is eighteen. For example, external terminals VCC, VSS, I/O (I/O-0 to I/O-7), RB, RE, CE, CLE, ALE, WE and WP are assigned to the bonding pads. In particular, VSS is assigned to two bonding pads.

The bonding pad to which VCC is assigned is a VCC input pad for applying a power supply potential (VCC). The bonding pads to which VSS are assigned are VSS input pads for applying a ground potential (VSS). The bonding pads to which I/O-0 to I/O-7 are assigned are input pads for inputting/outputting an address, a command and input/output data. The bonding pad to which RB is assigned is an output pad for notifying an external device of the internal operating status of the device. The bonding pad to which RE is assigned is an output pad for outputting data serially. The bonding pad to which CE is assigned is an input pad for receiving a device selecting signal. The bonding pad to which CLE is assigned is a pad for receiving a signal to control the transmission of an operating command to a command register (not shown) in the device. The bonding pad to which ALE is applied is a pad for receiving a signal to control the transmission of address data and input data to an address register and a data register (neither of which is shown) in the device. The bonding pad to which WE is applied is a pad for receiving a signal to control the transmission of data into the device from an I/O terminal. The bonding pad to which WP is applied is a pad for receiving a signal to forcibly inhibit data from being written and erased.

Example 1 of Lead Frame

Figure 6:
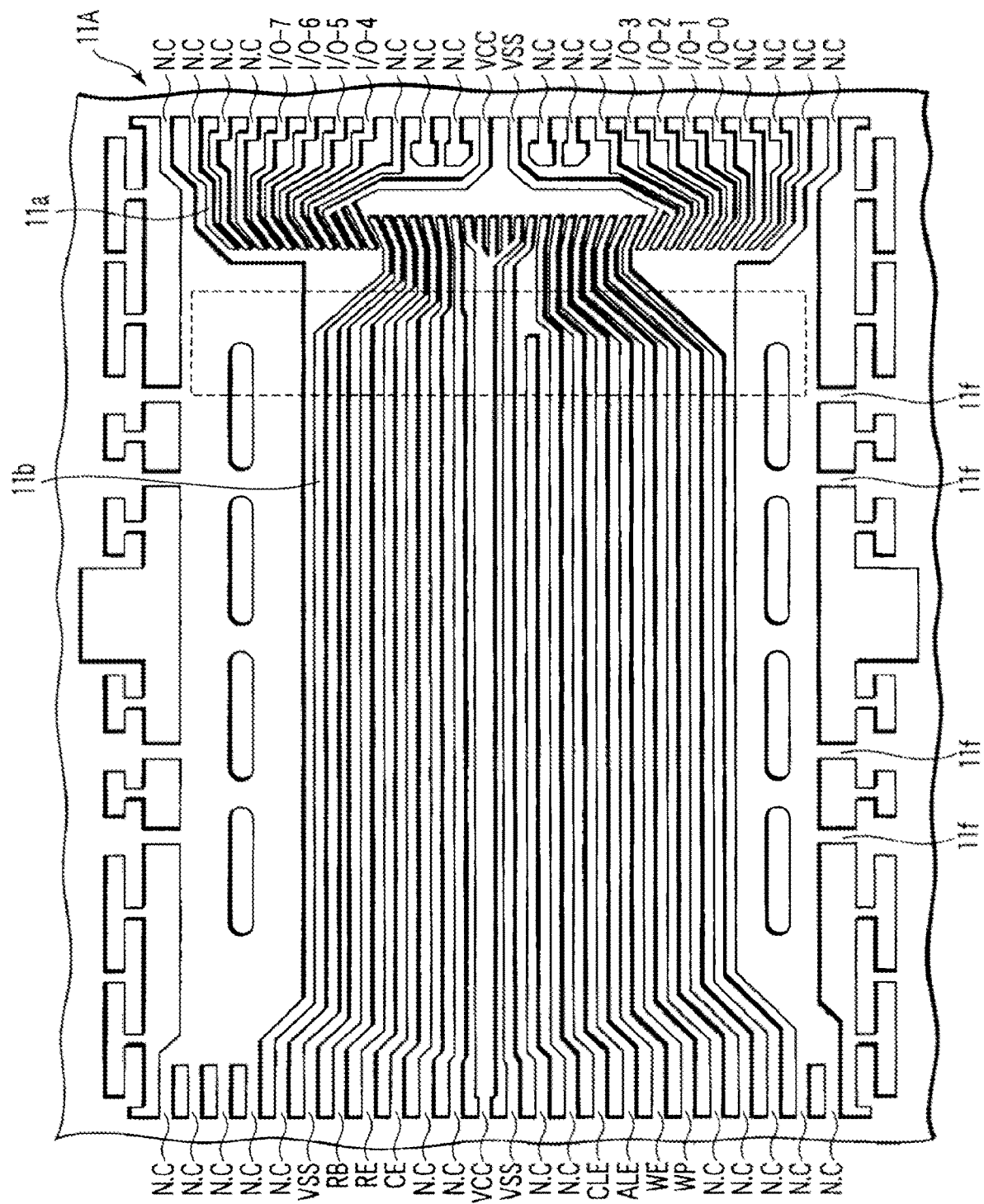
FIG. 6 is a plan view showing a configuration of a lead frame that is applied to the packaged semiconductor device shown in FIG. 1.

FIG. 6 specifically shows an example of a lead frame that is applied to the packaged semiconductor device according to the first embodiment of the present invention. In this example, a memory integrated circuit device such as a NAND flash memory is employed as the packaged semiconductor device. FIG. 6 shows a lead frame 11A whose internal leads are laterally opposed to the internal leads 11a and 11b of the lead frame 11 in the first embodiment. In FIG. 6, VCC, VSS, I/O-0 to I/O-7, RB, RE, CE, CLE, ALE, WE and WP are external terminals, and N.C is an unused (noncontact) internal lead.

Referring to FIG. 6, the tips of longer internal leads 11b are located locally close to the middle of the lead, frame 11A in its width direction, and the tips of shorter internal, leads 11a are located on both sides of a group of the longer internal leads 11b. Since the shorter internal leads 11a are difficult to bend sharply in terms of the manufacture of the lead frame 11A, it is favorable that they should be formed outside the longer internal leads 11b as described above. Since the longer internal leads 11b can be extended with a high degree of freedom, they are located close to the middle of the lead frame 11A.

The shorter internal leads 11a correspond to the external terminals I/O-0 to I/O-7 for 8-bit data input/output and are connected to their nearby pads by wire bonding.

In the lead frame 11A, the outermost leads, which are broader than the internal leads 11a and 11b, are connected to the hanging pin sections 11f and supported by the outside main body of the frame.

Example 2 of Lead Frame

Figure 7:
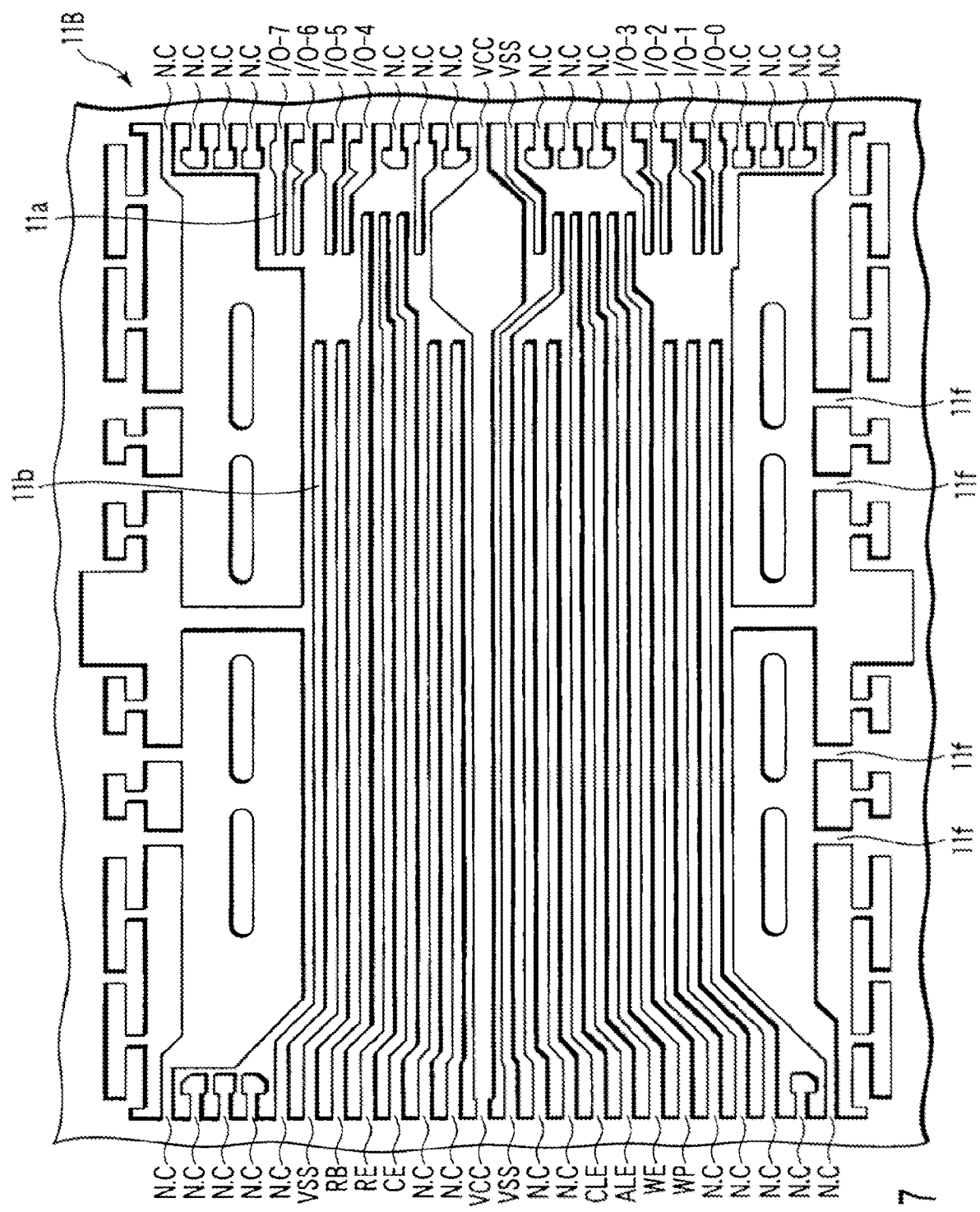
FIG. 7 is a plan view showing another configuration of the lead frame that is applied to the packaged semiconductor device shown in FIG. 1.

FIG. 7 specifically shows an example of a lead frame that is applied to the packaged semiconductor device according to the first embodiment of the present invention. In this example, a memory integrated circuit device such as a NAND flash memory is employed as the packaged semiconductor device. FIG. 7 shows a lead frame 11B whose internal leads are laterally opposed to the internal leads 11a and 11b of the lead frame 11 in the first embodiment. In FIG. 7, VCC, VSS, I/O-0 to I/O-7, RB, RE, CE, CLE, ALE, WE and WP are external terminals, and N.C is an unused (noncontact) internal lead.

Referring to FIG. 7, in each of two sections into which the lead frame 11B is divided in its width direction, the tips of longer internal leads 11b are located locally close to the middle of the section, and the tips of shorter internal leads 11a are located on both sides of a group of the longer internal leads 11b.

The shorter internal leads 11a corresponding to the external terminals I/O-0 to I/O-7 for 8-bit data input/output are remote from the bonding pads 13 and connected to their nearby pads by wire bonding.

In the lead frame 11B, the outermost leads, which are broader than the internal leads 11a and 11b, are connected to the hanging pin sections 11f and supported by the outside main body of the frame.

In the lead frame 11 of the first embodiment, preferably, the outermost leads are thickened and connected to the hanging pin sections 11f on the sides of the frame, or the hanging pin sections 11f are connected to each other in the package, and the support area of the chip 10 is increased when the chip 10 is to be mounted, as shown in FIGS. 6 and 7. Thus, the tips of the internal leads 11b are inhibited from being warped and the internal leads 11b can be prevented from being deformed due to the weight of the chip 10, as compared with the structure in which the chip 10 is supported by only the internal leads 11b arranged along one side thereof. Consequently, when the lead frame 11 is sealed with resin 15, the moldability of the sealed frame 11 can be improved, and the appearance of the device can be enhanced more than a device in which the chip 10 is fixed by the internal leads 11b only.

Figure 8:
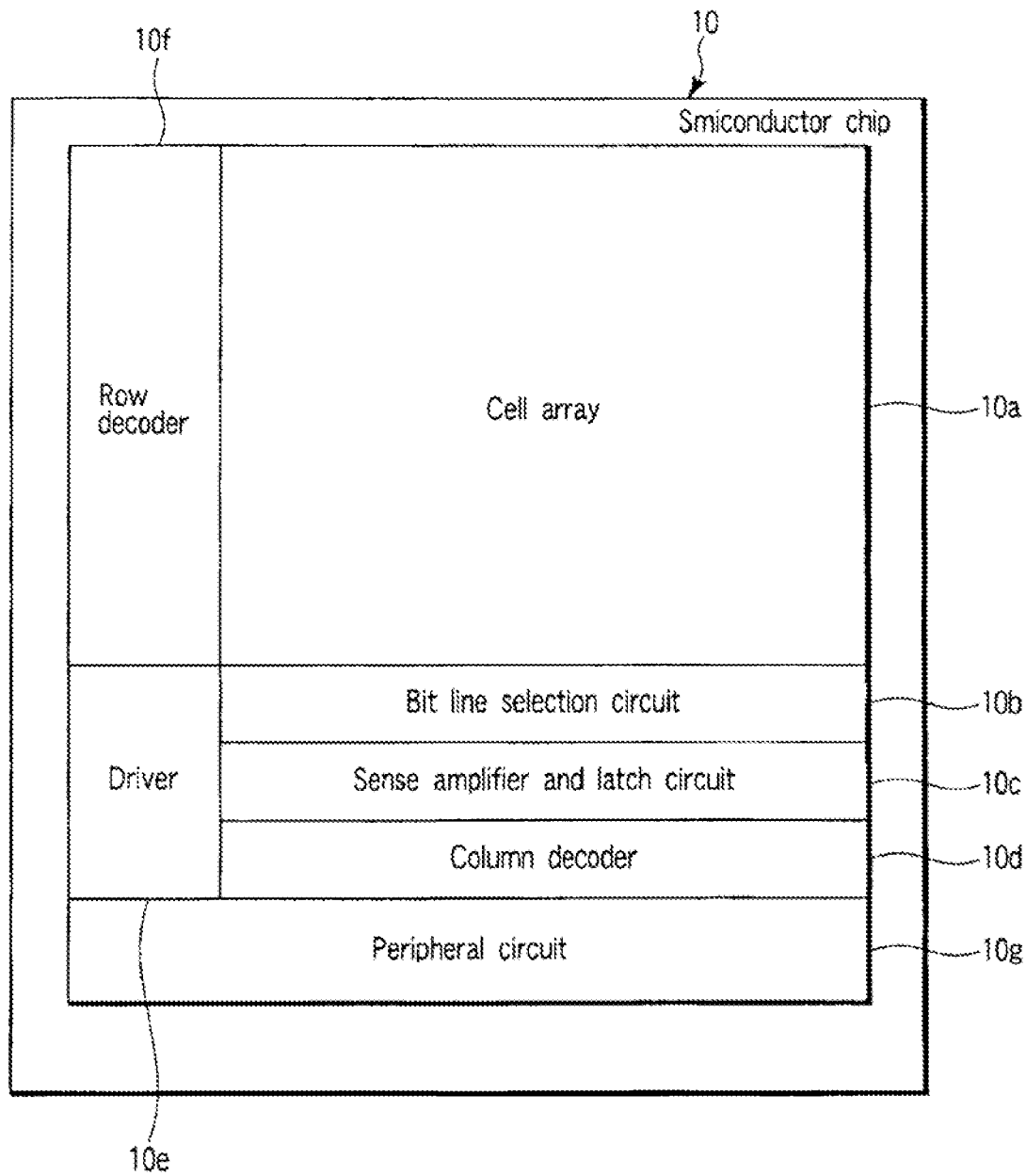
FIG. 8 is a plan view of the layout of a semiconductor chip, taking a NAND flash memory with bonding pads on one side as an example.

FIG. 8 shows a specific layout of a semiconductor chip that is applied to the packaged semiconductor device according to the first embodiment of the present invention. In this semiconductor chip, a NAND flash memory with pads along one side thereof is integrated monolithically.

The semiconductor chip 10 shown in FIG. 8 has a layout for a cell array 10a, a bit line selection circuit 10b, a sense amplifier and latch circuit 10c, a column decoder 10d, a driver 10e, a row decoder 10f, and a peripheral circuit 10g.

The cell array 10a includes a plurality of memory cells arranged in matrix. The cell array 10a also includes a plurality of word lines and selection gate lines that run in the row direction of the matrix, a plurality of bit lines that run in the column direction thereof, and a shield power supply (not shown) that supplies potential to shield odd-numbered bit lines and even-numbered bit lines.

The bit line selection circuit 10b is arranged adjacent to the cell array 10a in the column direction. The sense amplifier and latch circuit 10c and the column decoder 10d are arranged adjacent to one side of the bit line selection circuit 10b, which does not face the cell array 10a. The row decoder 10f is arranged adjacent to the cell array 10a in the row direction. The driver 10e is arranged close to the row decoder 10f in the column direction and close to the bit line selection circuit 10b, sense amplifier and latch circuit 10c and column decoder 10d in the row direction. The peripheral circuit 10g is arranged close to the driver 10e and the column decoder 10d in the column direction.

As described above, the driver 10e, which drives the bit line selection circuit 10b, is integrated. The degree of integration is thus improved and the device can be decreased in size.

The sense amplifier and latch circuit 10c amplifies and latches the data read out of a memory cell via a bit line.

When an odd-numbered bit line conducts to the sense amplifier and latch circuit 10c, the bit line selection circuit 10b conducts an even-numbered bit line to the shield power supply. When an even-numbered bit line conducts to the sense amplifier and latch circuit 10c, the bit line selection circuit 10b conducts an odd-numbered bit line to the shield power supply. The bit line selection circuit 10b has both a function of selecting a bit line and connecting it to the sense amplifier and latch circuit 10c and a function of connecting a non-selected bit line to the shield power supply. As compared with the case of two different circuits having these functions, the degree of integration can be improved and the device can be decreased in size.

A read operation of the NAND flash memory will be described in brief. The row decoder 10f selects one of blocks (not shown) of the cell array 10a and one of word lines (not shown). The driver 10e applies a potential Vsg (e.g., 3.5V) to a select gate in the selected block via the row decoder 10f and applies a ground potential GND to a select gate in the non-selected block. In read mode, the driver 10e applies a ground potential GND to the selected word line via the row decoder 10f and applies a voltage Vs (e.g., 3.5V) to the non-selected word line.

The column decoder 10d selects one of bit lines (not shown) in response to a column address signal from an address buffer of the peripheral circuit 10g. The sense amplifier and latch circuit 10c amplifies and latches the data that is received from the selected bit line via the bit line selection circuit 10b. The data is supplied from the sense amplifier and latch circuit 10c to an I/O buffer of the peripheral circuit 10g via the column decoder 10d.

Second Embodiment

Figure 9:
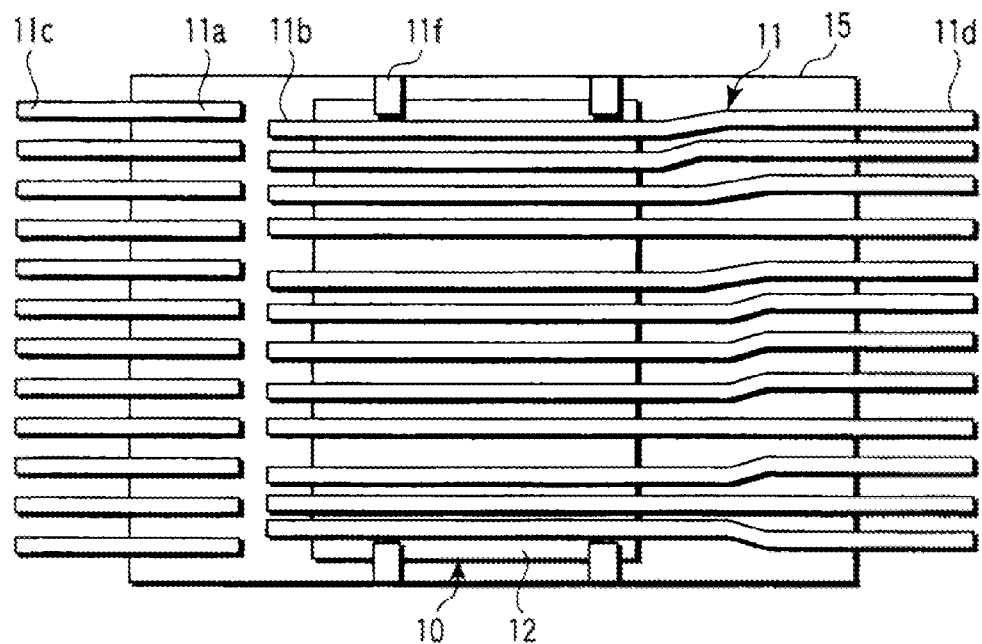
FIG. 9 is a top view of a packaged semiconductor device having a TSOP structure according to a second embodiment of the present invention to view the inside thereof from the top thereof.

FIG. 9 shows a basic configuration of a semiconductor device (packaged semiconductor device) having a TSOP structure according to a second embodiment of the present invention. FIG. 9 is a plan (top) view of the packaged semiconductor device to view the inside thereof from the top surface thereof. The same components as those of the packaged semiconductor device of the first embodiment are denoted by the same reference numerals and their detailed descriptions are omitted.

The second embodiment differs from the first embodiment in that a hanging pin section 11*f* is not connected to the outermost one of longer internal leads 11*b*, but adhered to the back surface of a semiconductor chip 10.

In the second embodiment, too, when a lead frame is sealed with resin 15, the moldability of the sealed frame can be stabilised and thus the appearance of the semiconductor device can be enhanced more than a device in which the chip 10 is fixed by the internal leads 11*b* only.

When the packaged semiconductor device according to the second embodiment is applied to, for example, a NAND flash memory, the lead frames 11A and 11B shown in FIGS. 6 and 7 can be adopted, except that the hanging pin sections are connected to the internal leads.

Third Embodiment

Figure 10:
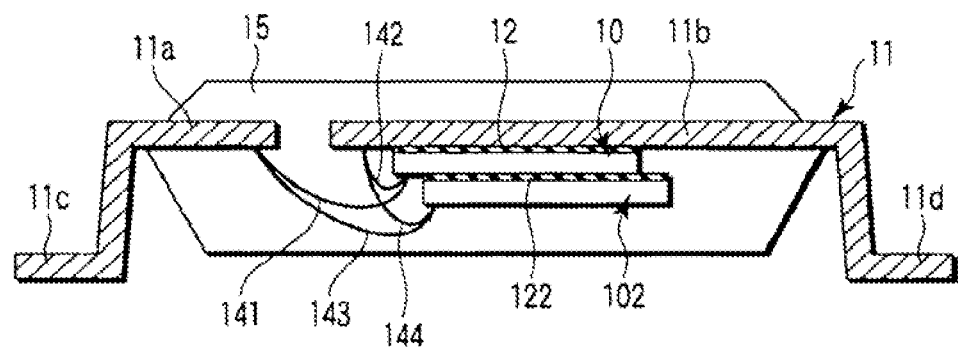
FIG. 10 is a sectional view showing a configuration of a packaged semiconductor device having a TSOP structure according to a third embodiment of the present invention.

FIG. 10 is a sectional view showing a configuration of a semiconductor device (packaged semiconductor device) having a TSOP structure according to a third embodiment of the present invention. The packaged semiconductor device of the third embodiment differs from that of the first embodiment in the following respect. As shown in FIG. 10, the device includes two semiconductor chips 10 and 102 each having pads along one side thereof. The pads of the chips 10 and 102 are of the same type and/or the same size and close to each ether. The chips 10 and 102 are horizontally displaced from each other and stacked one on another with an insulative adhesive 122 between them. Since the other components are the same as these of the first embodiment, they are denoted by the same reference numerals as those in FIG. 1.

In the semiconductor device shown in FIG. 10, the first chip 10 having first bonding pads (not shown but corresponding to the bonding pads 13 shown in FIG. 4A) is mounted on a hanging pin section (not shown) and a die lead section of longer internal leads 11*b* of a lead frame 11 with a thin organic insulation film 12 and a normal mounting agent therebetween. The second chip 102 has the same configuration as that of the first chip 10 and includes second bonding pads (not shown) along one side thereof. The second bonding pads of the second chip 102 are close to the first bonding pads of the first chip 10. The second chip 102 is stacked on but displaced from the first chip 10 with the insulative adhesive 122 therebetween.

The bonding wires of the third embodiment are divided into four bonding wire groups 141 to 144. The first bonding wire group 141 is used to connect the tips of some of the internal leads 11*a* on which the first chip 10 is not mounted to some of the first bonding pads on the first chip 10.

The second bonding wire group 142 is used to connect the tips of some of the internal leads 11*a* on which the first chip 10 is mounted to some of the first bonding pads on the first chip 10.

The third bonding wire group 143 is used to connect the tips of some of the internal leads 11*a* on which the first chip 10 is not mounted to some of the second bonding pads on the second chip 102.

The fourth bonding wire group 144 is used to connect the tips of some of the internal leads 11*a* on which the first chip 10 is mounted to some of the second bonding pads on the second chip 102.

The resin 15 is used to seal the internal leads 11*a* and 11*b*, hanging pin section, first and second chips 10 and 102 and bonding wire groups 141 to 144 to thereby form a resin package.

External leads 11*c* and 11*d* (each of which is part of the lead frame 11) communicate with their respective internal leads 11*a* and 11*b* and protrude as external terminals from at least opposed sides of the resin package.

The packaged semiconductor device shown in FIG. 10 has a COL structure and brings the same advantages as those of the first embodiment. More specifically, the first chip 10 is adhesively fixed to almost the middle portions of the longer internal leads 11*b* in their length direction, and the second chip 102 is adhesively fixed onto the first chip 10 and horizontally displaced therefrom. The bonding pads on the first and second chips 10 and 102 are connected to the tips of their nearby internal leads 11*a* and 11*b* by bonding pads. No long bonding wires are therefore required. Consequently, it is not likely that the bonding wires will be dropped or adjacent bonding wires will be electrically short-circuited when the lead frame is sealed with resin after the wire-bonding step. Accordingly, the semiconductor device is improved in reliability.

In particular, the hanging pin section of the lead frame 11 is fixed to the non-element-forming surface of the chip 10. When the lead frame 11 is sealed with resin 15, the moldability of the sealed frame 11 can be improved, and the appearance of the device can be enhanced more than a device in which the chip 10 is fixed by the internal leads 11*b* only.

Since the first chip 10 is fixed onto the internal leads lib by the organic insulation film 12, if is suitable for the TSOP structure, and the difference in level between the top surface of the chip and the internal leads 11*a* and 11*b* can be lessened to facilitate wire bonding. Since, moreover, the chips are stacked one on another, they can be mounted at high densities.

The present invention is not limited to the above first to third embodiments. For example, a lead frame having a lead fixing tape with an insulative adhesive can be adopted in order to prevent the longer internal leads 11*b* from being relatively shifted from each other or prevent the tips of the internal leads from contacting each other.

Fourth Embodiment

Figure 11:
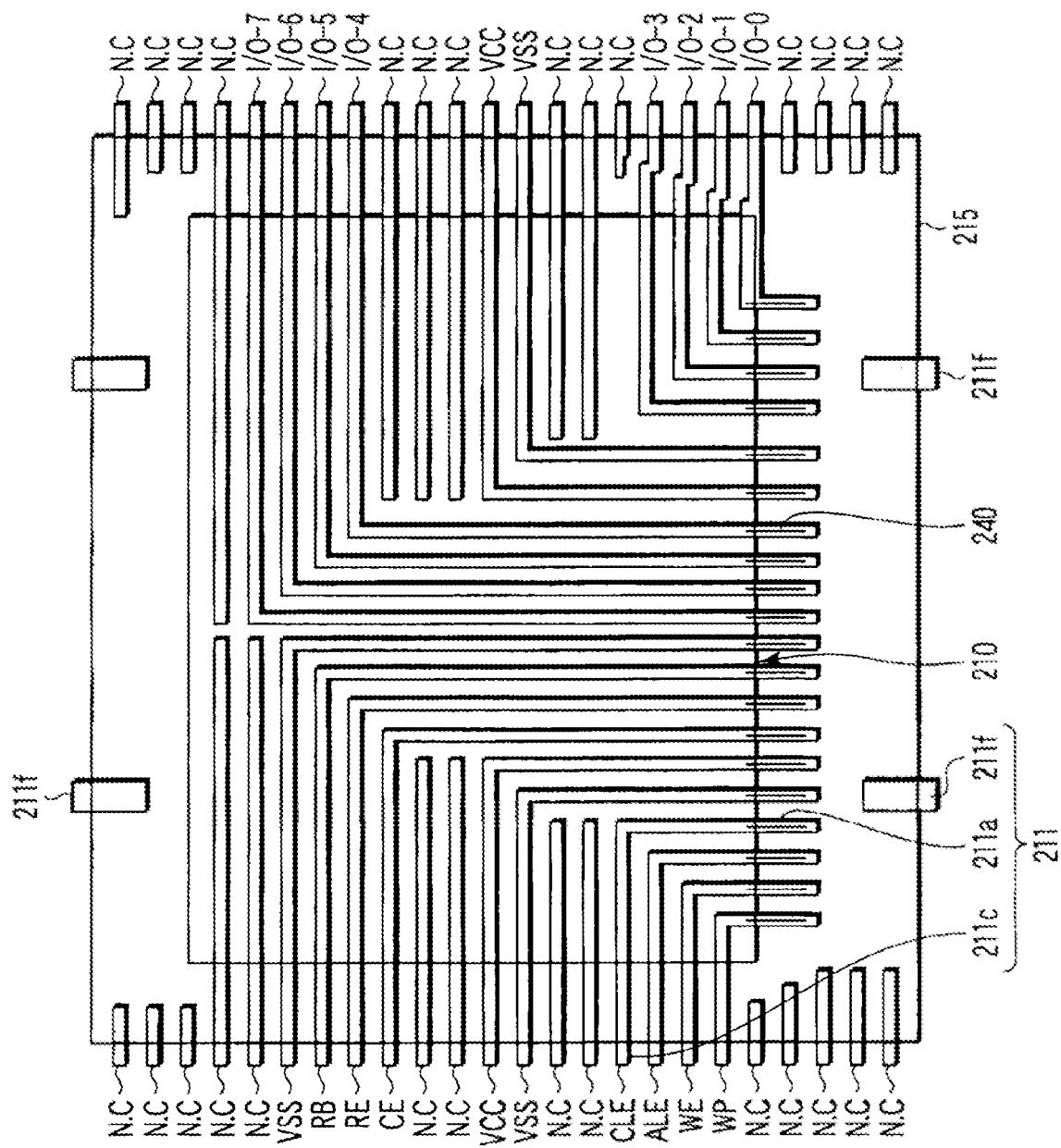
FIG. 11 is a bottom view of a packaged semiconductor device having a TSOP structure according to a fourth embodiment of the present invention to view the inside thereof from the bottom thereof.
Figure 12A:
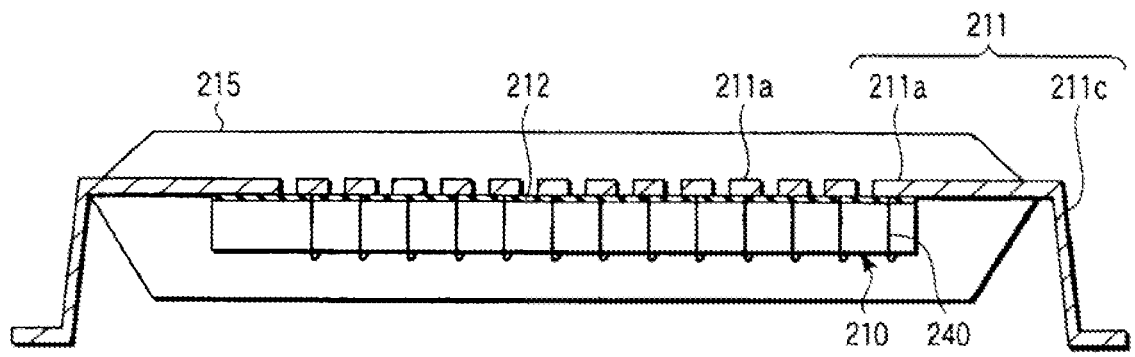
FIGS. 12A and 12B are sectional views each showing a configuration of the packaged semiconductor device shown in FIG. 11.
Figure 12B:
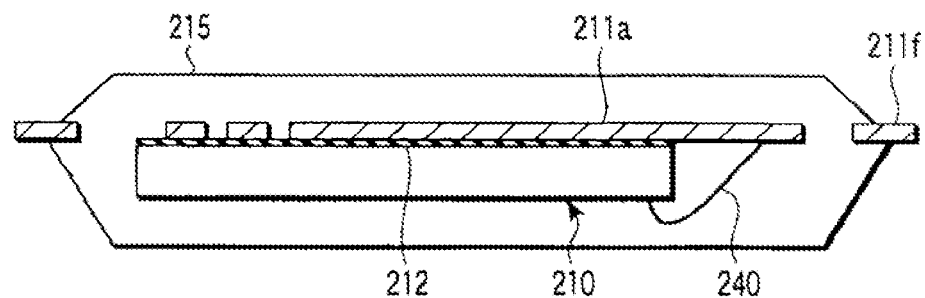

FIGS. 11 and 12A and 12B show a basic configuration of a semiconductor device (packaged semiconductor device) having a TSOP structure according to a fourth embodiment of the present invention. A memory integrated circuit device such as a NAND flash memory is employed as the packaged semiconductor device. Of these figures, FIG. 11 is a plan (top) view of the packaged semiconductor device to view the inside thereof from the top thereof, FIG. 12A is a sectional view of the tips of internal leads extending from external leads of the packaged semiconductor device, and FIG. 12B is a sectional view of a hanging pin section that is perpendicular to the longitudinal direction of the external leads.

Referring to FIGS. 11 and 12A and 12B, a lead frame 211 includes a plurality of hanging pin sections 211*f*, a plurality of external leads 211*c* which are drawn from the shorter sides of resin 215 of a package, and a plurality of internal leads 211 which are extended into the package from the external leads 211*c* and some of which are bent toward one of the longer sides of resin 215. The internal leads 211*a* are longer in the middle of the resin 215 in its longitudinal direction and become shorter with distance from the middle.

The internal leads connected to the external leads that are far from one of the longer sides of resin 215 are longer, while the internal leads connected to the external leads that, are close to the one of the longer sides of resin 215 are shorter.

The internal leads 211a excluding their tips are used as a die lead section (chip mounting section) on which a semiconductor chip 210 is mounted as a memory chip. The internal leads 211a are not depressed but almost flush with each other. Since the lead frame 211 is not depressed, there is no fear that a variation in amount of depression, will affect a device manufacturing process, complicate a frame manufacturing step, or adversely affect frame manufacturing yields.

In the fourth embodiment, the hanging pin sections 211f are not connected any of the internal leads 211a or the semiconductor chip (memory chip) 210.

Figure 13:
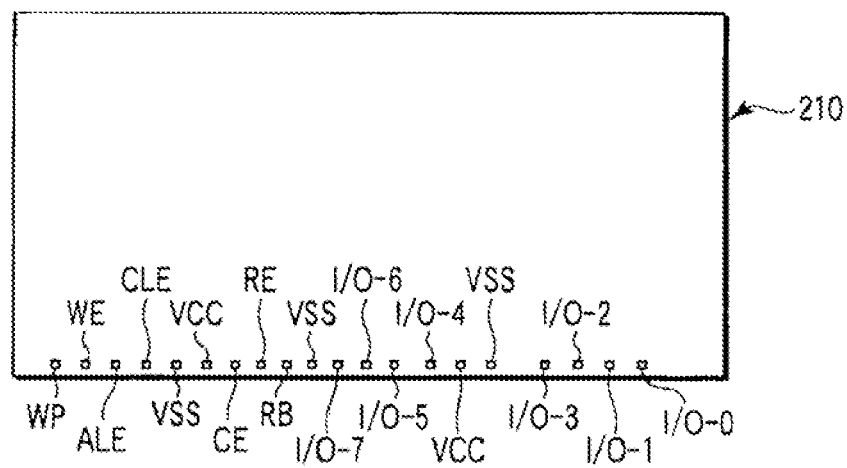
FIG. 13 is a plan (top) view showing a configuration of a semiconductor chip that is applied to the packaged semiconductor device shown in FIG. 11.

The semiconductor chip 210 has bonding pads along one longer side of the element forming surface thereof, as shown in FIG. 13. A thin sheet-shaped organic insulation film 212 having a thickness of about 20 μm to 40 μm is adhered to the back surface (element non-forming surface) of the chip 210. The organic insulation film 212 is made of, e.g., polyimide epoxy resin. In the fourth embodiment, too, the bonding pads are arranged locally along one of the longer sides of the chip 210; therefore, the chip 210 can be decreased in size.

As shown in FIGS. 12A and 12B, the chip 210 is mounted on the die lead section of the internal leads 211a with the organic insulation film 212 and a normal mounting agent therebetween. The chip 210 is so provided that their bonding pads are arranged close to the tips of the internal leads 211a. In other word(s), the longer side(s) of the chip 210 correspond to the longer sides of the resin 215, and the bonding pads are arranged to face the tips of the internal leads 211a.

The organic insulation film 212 is used to enhance the insulativeness between the back surface of the chip 210 and the die lead section. A film-shaped insulative adhesive, which is attached to the back of a wafer, can be used as the organic insulation film 212 in a scribe (dicing) step of separating the chip 210 from the wafer. There is a case where the organic insulation film 212 is not used when a plurality of semiconductor chips are stacked one on another.

The bonding pads of the semiconductor chip 220 are connected to the internal leads 211a of the lead frame 211 by bonding wires 240, respectively.

The internal leads 211a, hanging pin sections 211f, chip 210 and bonding wires 240 of the lead frame 211 are sealed with the resin 215 to form a rectangular resin package having a COL structure. The resin package is so configured that the sealed portion of the lead frame 221 on the chip-mounting surface (the back of the packaged semiconductor device) is thicker than that on the chip non-mounting surface (the surface of the packaged semiconductor device). Thus, the chip 210 is sealed facedown in almost the middle part of the resin package in its thickness direction.

The portions communicating with the internal leads 211a protrude from one of shorter sides of the resin package to form the external leads 211c (parts of the lead frame 211). Furthermore, the external leads 211c protrude from a position that is higher than the middle of the resin package in its thickness direction. The external leads 211c extend along the sides of the semiconductor chip 210 and bend toward the chip mounting surface of the lead frame 211. The tips of the external leads 211c bend away from the resin package and serve as external terminals.

According to the packaged semiconductor device shown in FIGS. 11, 12A and 12B, even though the longer side of the chip 210 along which the bonding pads are locally arranged cannot correspond to the shorter side of the resin 215 from which the external leads are protruded, the longer side of the chip 210 can correspond to the longer side of the resin 215 to thereby package the semiconductor device. A larger-sized semiconductor chip such as the chip 210 can thus be incorporated into the resin package by simply changing the design of the lead frame 211.

The bonding pads of the chip 210 are brought nearer to the tips of the internal leads 211a, or wire bonding is perforated on one side of the chip 210 along which the bonding pads are arranged. The bonding wires 240 need not be long. Consequently, it is not likely that the bonding wires will be dropped or adjacent bonding wires will be electrically short-circuited when the lead frame is sealed with resin after the wire-bonding step. Accordingly, the semiconductor device is improved in reliability.

The chip 210 is sealed facedown in the resin package. Even though the resin package surface on the chip non-mounting surface of the lead frame 211 is irradiated with laser beams for marking in a device assembly step, the adverse effects of causing damage to the chip 210 by laser beams transmitted through the resin 215 or causing a disconnection by laser beams transmitted through the bonding wires 240 can be lessened.

The packaged semiconductor device according to the fourth embodiment is not limited to a NAND flash memory. If, however, it is applied to a NAND flash memory, a lead frame 211' as shown in FIG. 14 can be adopted.

Fifth Embodiment

Figure 14:
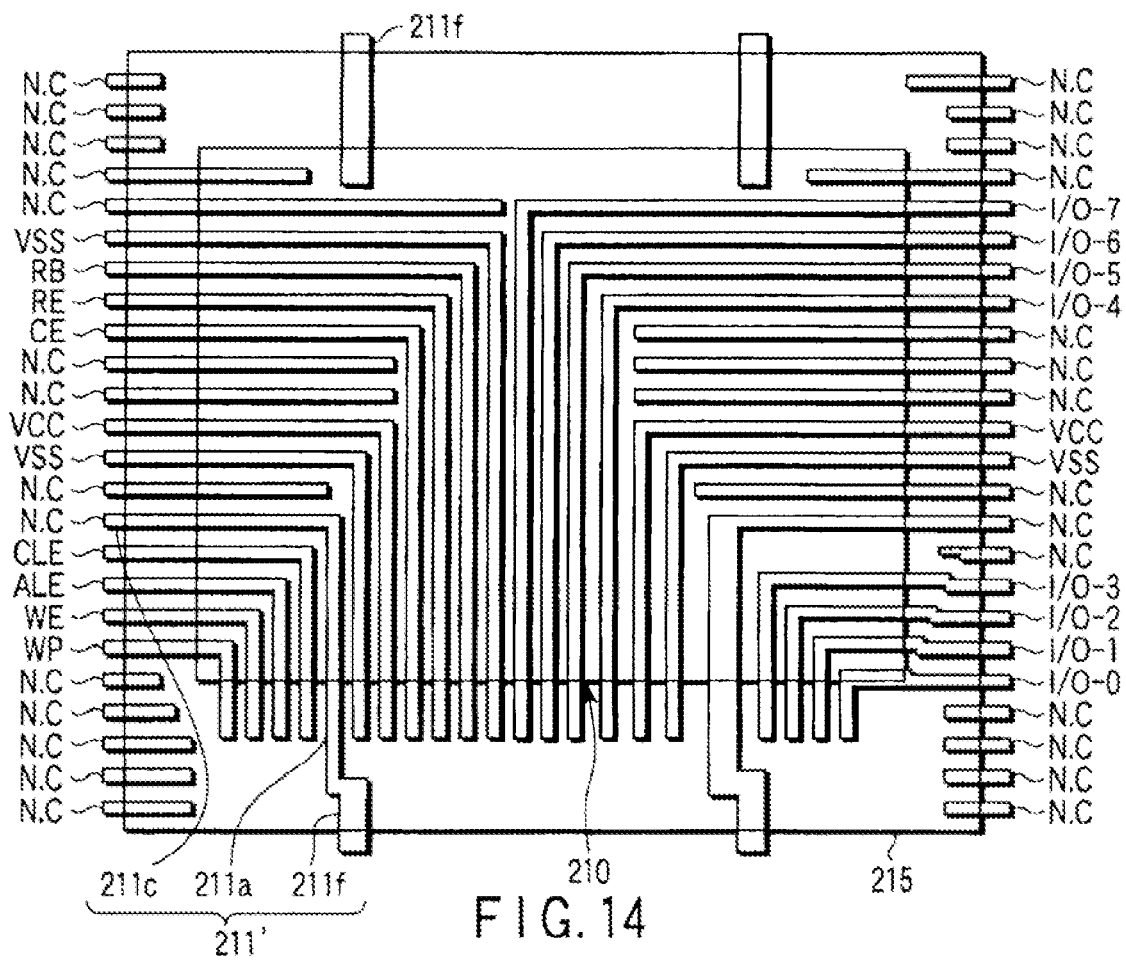
FIG. 14 is a top view of a packaged semiconductor device having a TSOP structure according to a fifth embodiment of the present invention to view the inside thereof from the top thereof.

FIG. 14 shows a basic configuration of a semiconductor device (packaged semiconductor device) having a TSOP structure according to a fifth embodiment of the present invention. FIG. 14 is a plan (top) view of the packaged semiconductor device to view the inside thereof from the top surface thereof. The same components as those of the packaged semiconductor device of the fourth embodiment are denoted by the same reference numerals and their detailed descriptions are omitted.

The fifth embodiment differs from the fourth embodiment in the following respect. Some of hanging pin sections 211f are not connected to internal leads 211a but adhered to the back surface of a semiconductor chip 210, and/or some of hanging pin sections 211f are used as some of internal leads 211a and adhered to the back surface of the semiconductor chip 210.

According to the fifth embodiment, when a lead frame 211' is sealed with resin 215, the moldability of the sealed frame can be stabilised further. Since the hanging pin sections 211f of the lead frame 211' are fixed to the element non-forming surface of the chip 210, the appearance of the semiconductor device can be enhanced more than a device in which the chip 210 is fixed by the internal leads 211a only.

Sixth Embodiment

Figure 15A:
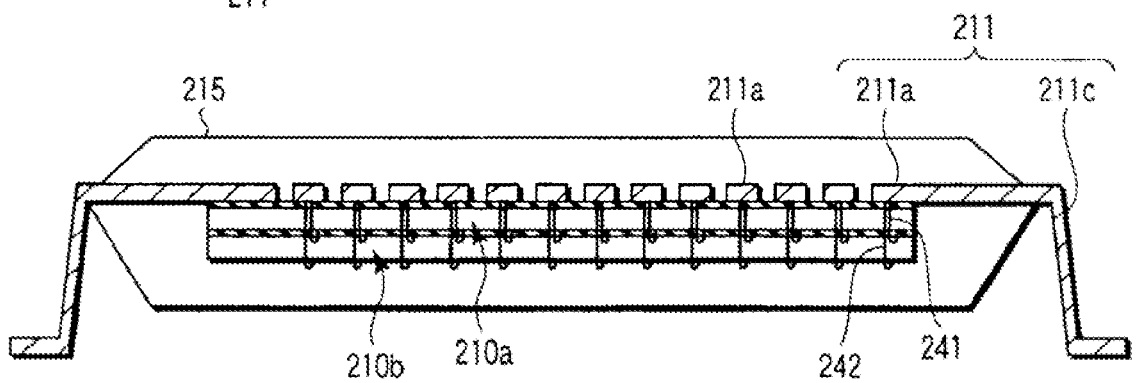
FIGS. 15A and 15B are sectional views each showing a configuration of a packaged semiconductor device having a TSOP structure according to a sixth embodiment of the present invention.
Figure 15B:
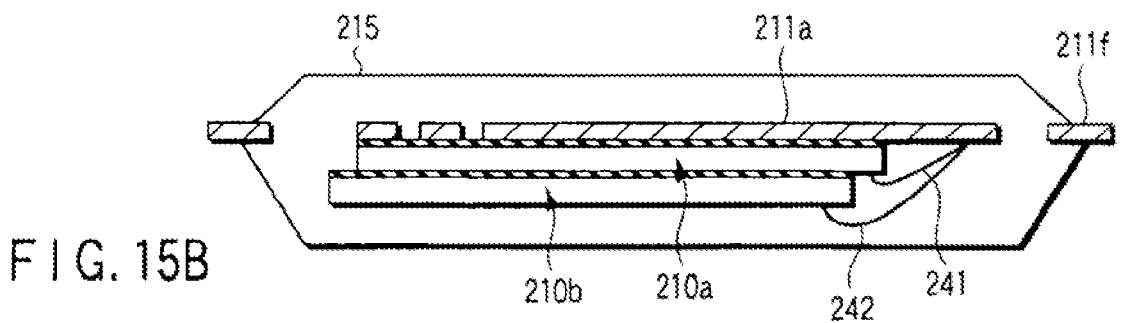

FIGS. 15A and 15B show a basic configuration of a semiconductor device (packaged semiconductor device) having a TSOP structure according to a sixth embodiment of the present invention. FIG. 15A is a sectional view of the tips of internal leads extending from external leads of the packaged semiconductor device, and FIG. 15B is a sectional view of a hanging pin section that is perpendicular to the longitudinal direction of the external leads.

The packaged semiconductor device of the sixth embodiment differs from that of the fourth embodiment in the following respect. As shown in FIGS. 15A and 15B, the device includes two semiconductor chips 210a and 210b each having pads along one side thereof. The pads of the chips 210a and 210b are of the same type and/or the same size and close to each other. The chips 210a and 210b are horizontally displaced from each other and stacked one on another with an insulative adhesive between them. Since the other components are the same as those of the fourth embodiment, they are denoted by the same reference numerals as those in FIG. 11.

In the semiconductor device shown in FIGS. 15A and 15B, the first chip 210a having first bonding pads (not shown) is mounted on a die lead section of internal leads 211a of a lead frame 211 with a thin organic insulation film 12 and a normal mounting agent therebetween. The second chip 210b has the same configuration as that of the first chip 210a and includes second bonding pads along one side thereof. The second bending pads of the second chip 210b are close to the first bonding pads of the first chip 210a The second chip 210b is stacked on but displaced from the first chip 210a with the insulative adhesive therebetween.

The bonding wires of the sixth embodiment are divided into two bonding wire groups 241 and 242. The first bonding wire group 241 is used to connect the tips of some of the internal leads 211a to some of the first bonding pads on the first chip 210a. The second bonding wire group 242 is used to connect the tips of some of the internal leads 211a to some of the second bonding pads on the first chip 210b.

The internal leads 211a, hanging pin sections 211f, chips 210a and 210b and bonding wire groups 241 and 242 of the lead frame 211 are sealed with resin 215 to form a rectangular resin package.

The external leads 211c (parts of the lead frame 211) communicating with the internal leads 221a protrude from the shorter sides of the resin package to form external terminals.

The packaged semiconductor device shown in FIGS. 15A and 15B has a COL structure and brings almost the same advantage as that of the device according to the fourth embodiment. In other words, a large-sized semiconductor chip, such as chips 210a and 210b whose longer sides are longer than the shorter sides of the resin package (or shorter than the longer sides thereof), can be incorporate into the resin package.

In particular, since the first chip 210a is fixed onto the internal leads 211a by the thin organic insulation film, it is suitable for the TSOP structure and the difference in level between the top surface of the chip and the internal leads 211a can be lessened to facilitate wire bonding.

Since the chips 210a and 210b are stacked one on another, they can be mounted at high densities. Therefore, the sixth embodiment is favorably applied to, for example, a NAND flash memory as a large-capacity memory chip, which requires a low-cost multilayer packaging technique.

The first chip 210a is adhesively fixed on the internal leads 211a, and the second chip 210b is adhesively fixed onto but horizontally displaced from the first chip 210a. The bonding pads of these chips 210a and 210b are connected to their nearby tips of the internal leads 211a. Thus, the bonding wires 241 and 242 need not be long. Consequently, it is not likely that the bonding wires will be dropped or adjacent bonding wires will be electrically short-circuited when the lead frame is sealed with resin after the wire-bonding step; accordingly, the semiconductor device is improved in reliability.

When the hanging pin sections 211f of the lead frame 212' are fixed on the element non-forming surface of the chip 210a (see FIG. 14), the lead frame 211' is sealed with resin 215 and its moldability can be stabilized further. The appearance of the semiconductor device can be enhanced more than a device in which the chip 210a is fixed by the internal leads 211a only.

The present invention is not limited to the above fourth to sixth embodiments. For example, a lead frame having a lead fixing tape with an insulative adhesive can be adopted in order to prevent the internal leads 211a from being relatively shifted from each other or prevent the tips of the internal leads from contacting each other.

Seventh Embodiment

Figure 16:
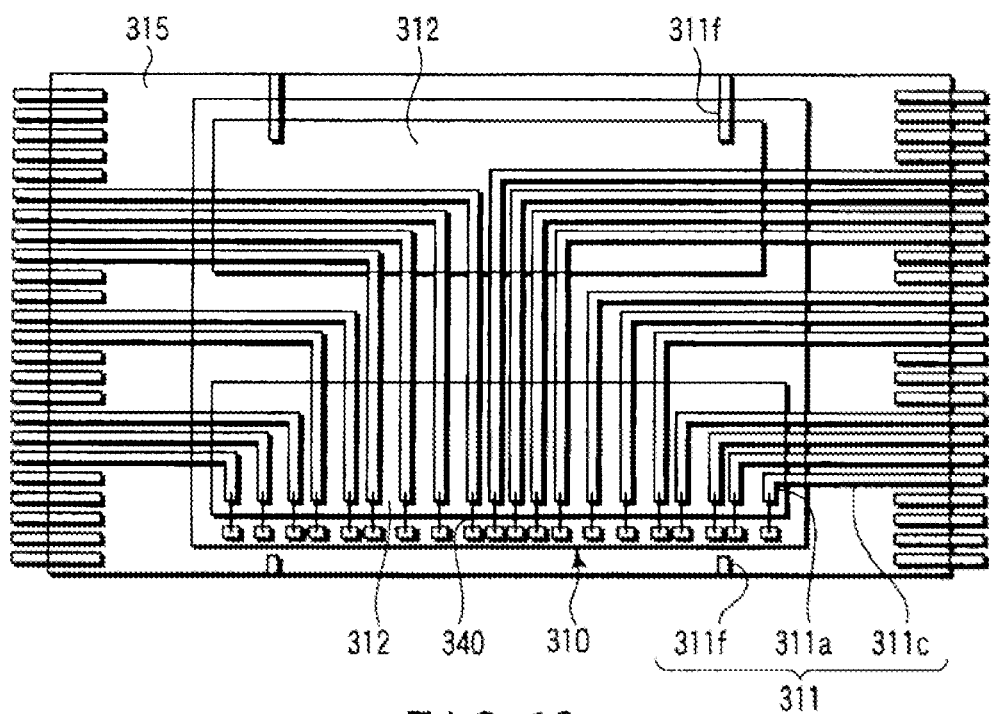
FIG. 16 is a bottom view showing a configuration of a packaged semiconductor device having a TSOP structure according to a seventh embodiment of the present invention.
Figure 17:
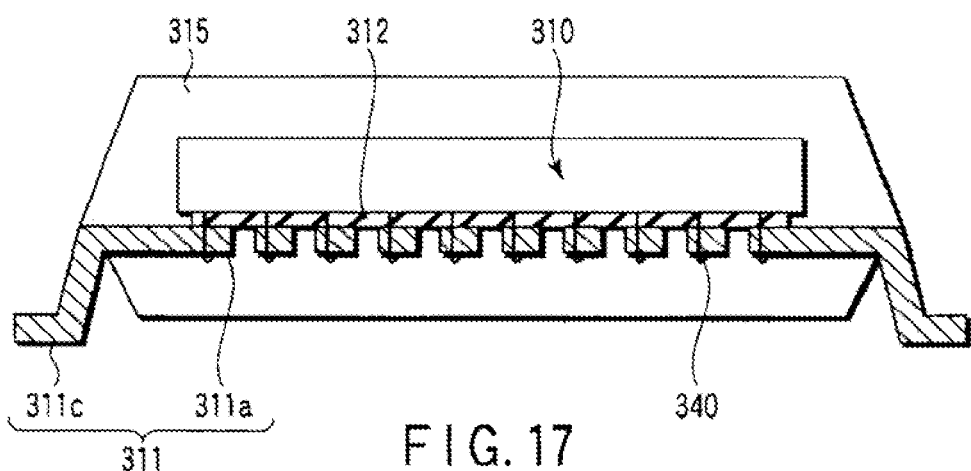
FIG. 17 is a sectional view of the configuration of the packaged semiconductor device shown in FIG. 16.

FIGS. 16 and 17 show a configuration of a semiconductor device (packaged semiconductor device) having a TSOP structure according to a seventh embodiment of the present invention. A memory integrated circuit device such as a NAND flash memory is employed as the packaged semiconductor device. Of these figures, FIG. 16 is a plan (bottom) view of the packaged semiconductor device to view the inside thereof front the bottom thereof, and FIG. 17 is a sectional view of the tips of internal leads extending from external leads of the packaged semiconductor device.

Referring to FIGS. 16 and 17, a lead frame 311 includes a plurality of hanging pin sections 311f, a plurality of external leads 311c which are drawn from the shorter sides of resin 315 of a package, and a plurality of internal leads 311a which are extended into the package from the external leads 311c and some of which are bent toward one of the longer sides of the resin 315. The internal leads 311a are longer in the middle of the resin 315 in its longitudinal direction and become shorter with distance from the middle. The internal leads connected to the external leads that are far from one of the longer sides of the resin 315 are longer, while the internal leads connected to the external leads that are close to the one of the longer sides of the resin 315 are shorter.

The internal leads 311a including their tips are used as a die lead section (chip mounting section) on which a semiconductor chip 310 is mounted as a memory chip. The internal leads 311a are not depressed but almost flush with each other. Since the lead frame 311 is not depressed, there is no fear that a variation in amount of depression will affect a device manufacturing process, complicate a frame manufacturing step, or adversely affect frame manufacturing yields.

In the seventh embodiment, the hanging pin sections 311f are not connected to any of the internal leads 311a, but some of the hanging pin sections 311f are fixed onto the element forming surface of the semiconductor chip 310.

The semiconductor chip 310 has bonding pads along one longer side of the element forming surface thereof. A thin sheet-shaped organic insulation film 312 having a thickness on about 20 μm to 40 μm is adhered to the same element forming surface of the chip 310. The organic insulation film 312 is made of, e.g., polyimide epoxy resin. In the seventh embodiment, too, the bonding pads are arranged locally along one of the longer sides of the chip 310; therefore, the chip 310 can be decreased in size.

As shown in FIG. 16, the chip 310 is mounted on the die lead section including the tips of the internal leads 311a of the lead frame 311, with the organic insulation film 312 and a normal mounting agent therebetween. The chip 310 is so provided that their bonding pads are arranged close to the tips of the internal leads 311a. In other words, the longer sides of the chip 310 correspond to the longer sides of the resin 315, and the bonding pads are arranged close to the tips of the internal leads 311a. In particular, the bonding pads of the semiconductor chip 310 correspond to extended portions of the tips of the internal leads 311a.

The bonding pads of the semiconductor chip 310 are connected to the internal leads 311a of the lead frame 311 by bonding wires 340, respectively. In the seventh embodiment, the wire bonding, or the bonding between the bonding pads and the tips of the internal leads by the bonding wires 340 is performed on the element forming surface of the semiconductor chip 310.

The internal leads 311a, hanging pin sections 311f, chip 310 and bonding wires 340 of the lead frame 311 are sealed with the resin 315 to form a rectangular resin package having a lead on chip (LOC) structure. The resin package is so configured that the sealed portion of the lead frame 311 on the chip non-mounting surface (the back of the packaged semiconductor device) is thicker than that on the chip mounting surface (the surface of the packaged semiconductor device). Thus, the chip 310 is sealed facedown slightly above almost the middle part of the resin package in its thickness direction.

The portions communicating with the internal leads 311a protrude from one of shorter sides of the resin package to form the external leads 311c (parts of the lead frame 311). Furthermore, the external leads 311c protrude from a position that is slightly displaced downward from the middle of the resin package in its thickness direction. The external leads 311c extend along the sides of the semiconductor chip 310 and bend toward the chip non-mounting surface of the lead frame 311. The tips of the external leads 311c bend away from the resin package and serve as external terminals.

According to the packaged semiconductor device shown in FIGS. 16 and 17, even though the longer side of the chip 310 along which the bonding pads are locally arranged cannot correspond to the shorter side of the resin 315 from which the external leads are protruded, the longer side of the chip 310 can correspond to the longer side of the resin 315 to thereby package the semiconductor device. A larger-sized semiconductor chip such as the chip 310 can thus be incorporated into the resin package by simply changing the design of the lead frame 311.

In particular, when the wire bonding for bonding the bonding pads and the internal leads 311a is performed on the surface (element forming surface) of the semiconductor chip 310, a larger-sized semiconductor chip can be mounted on the packaged semiconductor device of the same size. Conversely, a smaller-sized packaged semiconductor device can be achieved if the size of the chip 310 is unchanged.

Moreover, when the hanging pin sections 311f of the lead frame 311 are fixed on the element forming surface of the chip 310, the moldability of the frame sealed with the resin 315 can be stabilized, and the appearance of the device can be improved more than a device in which the chip 310 is fixed by the internal leads 311a only.

The bonding pads of the chip 310 are brought nearer to the tips of the internal leads 311a, or wire bonding is perforated on one side of the chip 310 along which the bonding pads are arranged. The bonding wires 340 need not be long. Consequently, it is not likely that the bonding wires will be dropped or adjacent bonding wires will be electrically short-circuited when the lead frame is sealed with resin after the wire-bonding step. Accordingly, the semiconductor device is improved in reliability.

The chip 310 is sealed facedown in the resin package. Even though the resin package surface on the chip mounting surface of the lead frame 311 is irradiated with laser beams for marking in a device assembly step, the adverse effects of causing damage to the chip 310 by laser beams transmitted through the resin 315 or causing a disconnection by laser beams transmitted through the bonding wires 340 can be lessened.

Figure 18A:
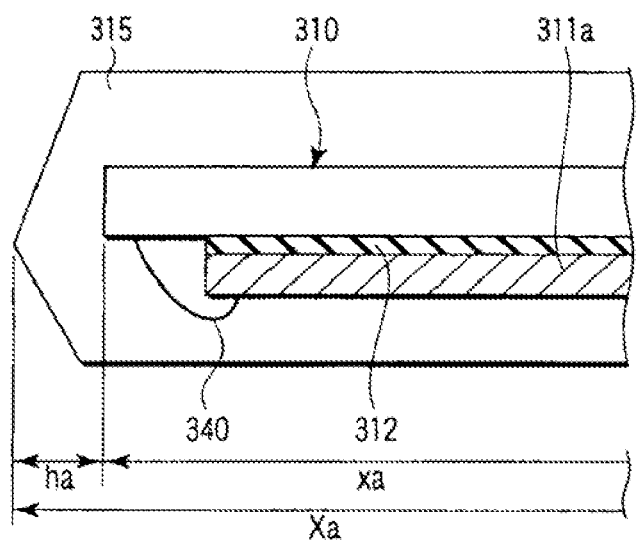
FIGS. 18A and 18B are comparative diagrams showing a comparison between a section of the packaged semiconductor device shown in FIG. 16 and that of another packaged semiconductor device.
Figure 18B:
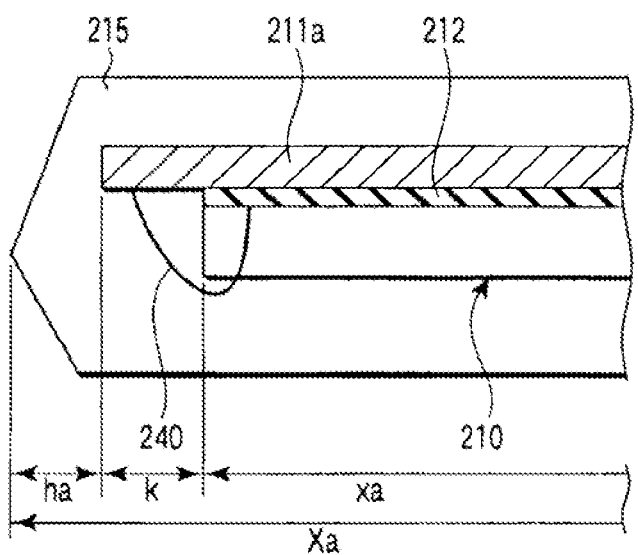

FIGS. 18A and 18B are sectional views of an end portion of the packaged semiconductor device, which is taken along the line perpendicular to the projection direction of the external lead. FIG. 18A shows the packaged semiconductor device shown in FIG. 16 as an example, and FIG. 18B shows the packaged semiconductor device shown in FIG. 11 as an example.

If the length of a short side of the packaged semiconductor device shown in FIG. 18A is Xa, Xa is defined by xa+2×ha where xa is the length of a short side of the chip 310 and ha is the width of resin. In contrast, if the length of a short side of the packaged semiconductor device shown in FIG. 18B is Xa, Xa is defined by xa+2×ha+k where xa is the length of a short side of the chip 210, ha is the width of resin, and k is the length of a lead projection. The width ha of resin corresponds to the thickness of resin 315 from one end of the resin package to the chip 310 and the thickness of resin 215 from one end of the resin package to the tip of the lead 211a.

In short, when Xa and ha are the same, the semiconductor chip 310 which is larger than the semiconductor chip 210 by the length k of the lead projection can be mounted. In contrast, xa in the chip 210 and xa in the chip 310 are the same, a packaged semiconductor device of smaller size (Xa) can be achieved.

None of the above embodiments are limited to a configuration in which a semiconductor chip is sealed facedown in a resin package. The embodiments can be applied to a configuration in which a semiconductor chip is sealed face up in a resin package.

Eighth Embodiment

Figure 19:
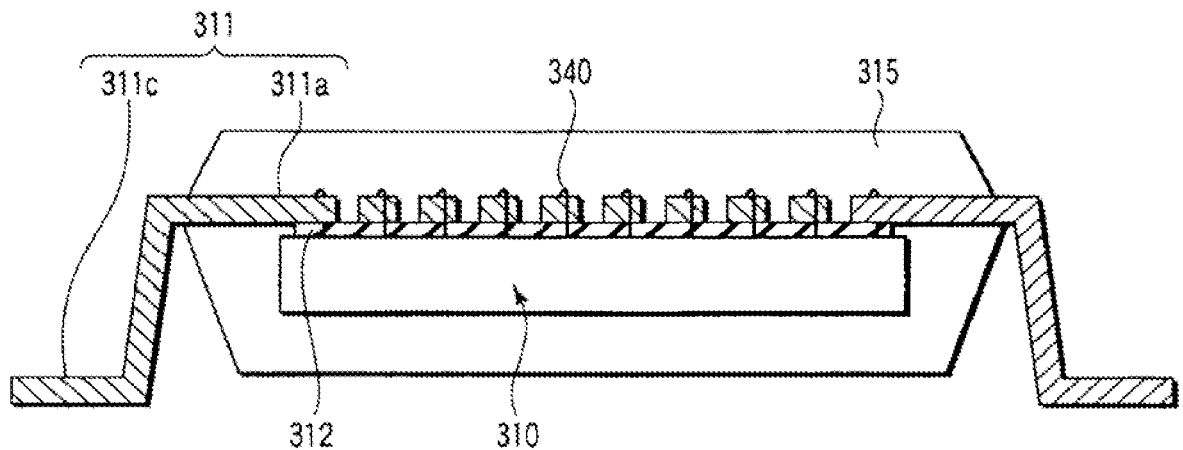
FIG. 19 is a sectional view showing a configuration of a packaged semiconductor device having a TSOP structure according to an eighth embodiment of the present invention.

FIG. 19 shows a configuration of a semiconductor device (packaged semiconductor device) having a TSOP structure according to an eighth embodiment of the present invention. FIG. 19 is a sectional view of the tips of internal leads extending from external leads of the packaged semiconductor device. The top view or the packaged semiconductor device is almost equivalent to the bottom view of FIG. 16.

The eighth embodiment differs from the seventh embodiment in that a semiconductor chip mounted on a lead frame is sealed face up in a resin package. More specifically, the packaged semiconductor device shown in FIG. 19 differs from that of the seventh embodiment in the following respect. The external leads 311c of a lead frame 311 extend along the sides of the semiconductor chip 310 and bend toward the chip mounting surface of the lead frame 311. The tips of the external leads 311c bend away from the resin package and serve as external terminals. Since the other components are the same as those of the seventh embodiment, they are denoted by the same reference numerals as those in FIG. 17.

The semiconductor chip 310 has bonding pads on its one side. Referring to FIG. 13, the chip 310 is mounted on a die lead section of internal leads 311a of the lead frame 311, with a thin organic insulation film 312 and a normal mount agent interposed therebetween.

Bonding wires 340 are formed on the surface (element forming surface) of the chip 310 to bond the tips of the internal leads 311a and the bonding pads on the chip 310.

The internal leads 311a, hanging pin sections (not shown), chip 310 and bonding wires 340 are sealed with resin 315 to form a rectangular resin package.

The external leads 311c (parts of the lead frame 311) are connected to the internal leads 331a and protruded from a pair of short sides of the resin package. The external leads 311c thus serve as external terminals.

According to the semiconductor package device shown in FIG. 19, a large-sized semiconductor chip whose long sides are longer than the short sides of the resin package (shorter than the long sides of the resin package) can be mounted in the resin package, as in the foregoing seventh embodiment.

In particular, when the wire bonding for bonding the bonding pads and the internal leads 311a is performed on the surface (element forming surface) of the semiconductor chip 310, a larger-sized semiconductor chip can be mounted on the packaged semiconductor device of the same size. Conversely, a smaller-sized packaged semiconductor device can be achieved if the size of the chip 310 is unchanged.

Moreover, when the hanging pin sections of the lead frame 311 are fixed on the element forming surface of the chip 310, the moldability of the frame sealed with the resin 315 can be stabilized, and the appearance of the device can be improved more than a device in which the chip 310 is fixed by the internal leads 311a only.

The bonding wires 340 need not be long; consequently, it is not likely that the bonding wires will be dropped and adjacent bonding wires will be electrically short-circuited when the lead frame is sealed with resin after the wire-bonding step. Accordingly, the semiconductor device is improved in reliability.

Since the chip 310 is fixed on the internal leads 311a by the thin organic insulation film 312, it is suitable for the TSOP structure. A difference between the level of the top of the chip and that of the internal leads 311a can be lessened to facilitate a wire bonding process.

None of the above embodiments are limited to a product using a resin package, but they can be applied to, for example, a packaged plastic product.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device, comprising:
   a resin;
   a first terminal group, which is located outside the resin and is provided on a first side, the first terminal group including a plurality of first terminals;
   a second terminal group, which is located outside the resin and is provided on a second side, which is an opposite side of the first side, the second terminal group including a plurality of second terminals;
   a first internal lead group including a plurality of first internal leads electrically connected to at least part of the plurality of first terminals, the first internal lead group extending inside the resin toward the second side;
   a second internal lead group including a plurality of second internal leads electrically connected to at least part of the plurality of second terminals, the second internal lead group extending inside the resin toward the first side;
   a semiconductor chip provided above the first internal lead group, a plurality of first pads and a plurality of second pads being provided at one end portion of the semiconductor chip on the second side;
   a plurality of first wires mutually connecting the first pads and a first tip group including tips of the plurality of first internal leads;
   a plurality of second wires mutually connecting the second pads and a second tip group including tips of the plurality of second internal leads;
   a third terminal that is located outside the resin and provided on the first side;
   a fourth terminal that is located outside the resin and provided on the second side; and
   a center wiring that is located inside the resin, physically connected to the third terminal and the fourth terminal, and provided underneath the semiconductor chip,
   wherein the first tip group and the second tip group are arranged substantially on a same plane.

2. The semiconductor device of claim 1, wherein the first internal lead group and the second internal lead group share substantially the same plane.

3. The semiconductor device of claim 1, wherein the first internal lead group, the second internal lead group, and the center wiring share substantially the same plane.

4. The semiconductor device of claim 1, wherein the third terminal and the fourth terminal are connected to a power supply.

5. The semiconductor device of claim 1, wherein the center wiring has a broad portion on the second side, the broad portion having an increased wiring width.

6. The semiconductor device of claim 1, wherein
   a fifth terminal provided at one end of the first terminal group and a sixth terminal provided at one end of the second terminal group are not wired to the semiconductor chip.

7. The semiconductor device of claim 6, wherein
   a seventh terminal provided at another end of the first terminal group and an eighth terminal at another end of the second terminal group are not wired to the semiconductor chip.

8. The semiconductor device of claim 6, wherein
   a ninth terminal adjacent to the fifth terminal and a tenth terminal adjacent to the sixth terminal are not wired to the semiconductor chip.

* * * * *